(12) United States Patent
Ohki et al.

(10) Patent No.: US 9,386,258 B2
(45) Date of Patent: Jul. 5, 2016

(54) DISPLAY DEVICE, TELEVISION RECEIVER AND ELECTRONIC DEVICE

(71) Applicant: SHARP KABUSHIKI KAISHA, Osaka-shi, Osaka (JP)

(72) Inventors: Kentaroh Ohki, Osaka (JP); Tsuyoshi Ohshima, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 14/424,942

(22) PCT Filed: Aug. 16, 2013

(86) PCT No.: PCT/JP2013/071994
§ 371 (c)(1),
(2) Date: Feb. 27, 2015

(87) PCT Pub. No.: WO2014/034440
PCT Pub. Date: Mar. 6, 2014

(65) Prior Publication Data
US 2015/0237291 A1  Aug. 20, 2015

(30) Foreign Application Priority Data

Aug. 31, 2012 (JP) .................................. 2012-192134

(51) Int. Cl.
*H04N 5/645* (2006.01)
*H04N 5/64* (2006.01)
*H04N 5/655* (2006.01)
*H04N 5/44* (2011.01)
*H05K 5/00* (2006.01)
*H05K 5/02* (2006.01)

(52) U.S. Cl.
CPC ................. *H04N 5/645* (2013.01); *H04N 5/44* (2013.01); *H04N 5/655* (2013.01); *H05K 5/0008* (2013.01); *H05K 5/0017* (2013.01); *H05K 5/0234* (2013.01)

(58) Field of Classification Search
CPC .......... H04N 5/44; H04N 5/645; H04N 5/655
USPC ......... 348/794, 787, 789, 836, 825, 843, 725; 361/679.01, 679.02; 411/366.1, 372.6
See application file for complete search history.

(56) References Cited

U.S. PATENT DOCUMENTS

| | | | | |
|---|---|---|---|---|
| 7,988,121 B2 * | 8/2011 | Kameoka | ............... | F16M 11/04 248/317 |
| 8,988,868 B2 * | 3/2015 | Harita | ...................... | H05K 5/02 361/679.22 |
| 2013/0021532 A1 * | 1/2013 | Yonezawa | ................ | H04N 5/64 348/725 |

FOREIGN PATENT DOCUMENTS

| | | |
|---|---|---|
| JP | 62-73590 U | 5/1987 |
| JP | 2011-249975 A | 12/2011 |
| JP | 2012-14100 A | 1/2012 |

OTHER PUBLICATIONS

International Search Report, issued in PCT/JP2013/071994, dated Nov. 5, 2013.

*Primary Examiner* — Jefferey Harold
*Assistant Examiner* — Jean W Desir
(74) *Attorney, Agent, or Firm* — Birch, Stewart, Kolasch & Birch, LLP

(57) ABSTRACT

Provided are a mounting member which may be fixed to a substrate with a simple structure without using a solder, and easily mount the substrate to another member having a simple structure, while maintaining stable fixation to the substrate, a display device including the mounting member, and a television receiver including the display device. The mounting member includes a first abutting plate part formed in a square flat shape, a side abutting plate part connected to the first abutting plate part at a right angle, and a second abutting plate part connected to the side abutting plate part at a right angle. The mounting member is mounted so as to pinch a portion of an edge part of the substrate. The other member abuts the first abutting plate part, and a screw is inserted into a screw insertion hole of the other member, the screw insertion hole of the first abutting plate part, and the screw insertion hole of the substrate, and screwed to a female thread such that the substrate is mounted to the other member.

17 Claims, 8 Drawing Sheets

F I G. 1
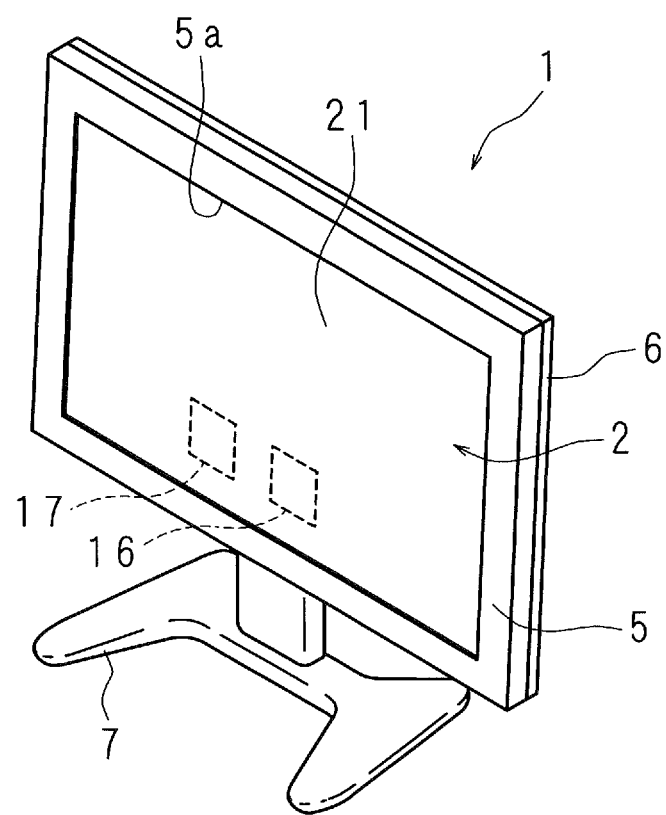

F I G. 2
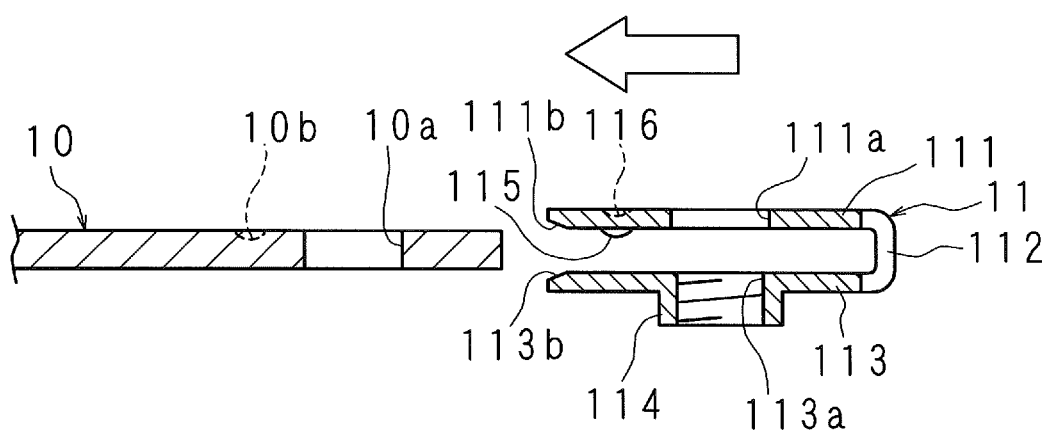

DISPLAY DEVICE, TELEVISION RECEIVER AND ELECTRONIC DEVICE

CROSS-REFERENCE TO RELATED APPLICATIONS

This application is the National Phase under 35 U.S.C. §371 of PCT International Application No. PCT/JP2013/71994 which has an International filing date of Aug. 16, 2013 and designated the United States of America, which claims priority under 35 U.S.C. 119(a) to Patent Application No. 2012-192134, filed in Japan on Aug. 31, 2012, all of which are hereby expressly incorporated by reference into the present application.

BACKGROUND

1. Technical Field

The present invention relates to a display device including a mounting member which is fixed to a substrate for mounting the substrate to another member, and a television receiver including the display device and an electronic device including the mounting member.

2. Description of Related Art

A thin type television receiver (hereinafter, referred to as a TV receiver) such as a liquid crystal television receiver has a display module (in the case of a liquid crystal TV receiver, a liquid crystal display module), and a substrate which drives the display module. The display module is housed between a front cabinet and a rear cabinet which are disposed in front and back in a vertical orientation. In the case of the liquid crystal display module, the display module includes, for example, a backlight unit having a display panel, an optical sheet, a diffusion plate, a reflection sheet, and a chassis. A light source such as an LED etc., is provided in the chassis.

Conventionally, the display module is provided with a screw receiving part on a back surface thereof for fixing the substrate, and the substrate is fixed to the back surface of the display module by screwing. However, when the display module is provided with the screw receiving part, only the substrate appropriate for a specific screwing position may be mounted on the display module, thus there is a problem that versatility is low.

Therefore, recently, it has become common that the display module is not provided with the screw receiving part. In this case, the substrate is disposed to a tray referred to as a sheet metal holder or a chassis tray, or an equivalent thereof, and the tray is mounted on the chassis, such that the substrate is fixed to the display module.

However, as the size of the chassis tray, etc. becoming larger, cost may become expensive, and a mounting operation may become complicated.

Without using the chassis tray, etc., fixing the substrate to the rear cabinet may be considered. In this case, a harness for electrically connecting a circuit of the front cabinet side with the substrate controlling the circuit becomes longer. When a length of the harness is short, it may become difficult to assemble, and since wiring shaping after connecting is performed while fastening the front cabinet and the rear cabinet, there is a problem that the wiring shaping and assembling may be difficult.

There is also a display device having a structure in which a lug having a female thread as a mounting member is previously fixed to the rear cabinet side of the substrate by soldering, the circuit of the front cabinet side and the substrate are electrically connected with each other, and after wiring shaping, the rear cabinet is screwed to the lug so as to fix the substrate. However, a fixing strength between the substrate and the rear cabinet depends on the soldering strength of the lug. Since fixation of the screw with the lug across the rear cabinet is performed by the screw, the strength thereof is strong. But, since the fixation of the lug with the substrate depends on soldering, when the solder is not sufficiently applied, and a vibration and shock etc., are applied thereto, a force may act on the soldering portion. As a result of such a force being applied, when the substrate and the lug are separated from each other due to releasing of the soldering portion, the fixation of the rear cabinet with the substrate may be loosened.

In addition, when mounting the lug having the female thread on the back side of the display module of the substrate, a problem similar to the case of mounting the lug on the rear cabinet side of the substrate may occur. However, even when the jointing of the solder is released, since the screw penetrates the substrate and then the lug is screwed, fixation of the rear cabinet with the substrate may be maintained. When fixing by soldering, there is a need to form the lug of a metal material, but when having a soldering process by a DIP for fixing another part, a portion in which the female thread is cut is covered with solder, such that there is a need for the lug to close a hole in which the screw is inserted by a heat resistance tape. Application of the tape becomes a factor of increasing costs due to an increase in the number of parts and manufacturing process.

Further, in order to reduce the manufacturing costs, when mounting the parts only on one side of the substrate, commonly, terminals for a user are present on the rear cabinet side of the substrate, and thereby, it is not possible to mount the parts on the back side of the display module. Therefore, special measures are required, and also become a factor in terms of increasing costs.

As an apparatus that can electrically connect a circuit member of the display module with the substrate, and mount the substrate after wiring shaping on the rear cabinet, there are display devices of Japanese Patent Laid-open No. 2011-249975 and Japanese Patent Laid-open No. 2012-14100 as described below.

Japanese Patent Laid-open No. 2011-249975 discloses an invention of a display device which includes a display panel, a sheet metal holder, and a back cover covering a back surface of the display panel, has a concave portion having a bottom which is open to the back side on the back cover, and is configured in such a manner that, when a power board and HDD are housed in the concave portion, the opening of the concave portion is closed by a replacement lid. By this configuration, the invention of Japanese Patent Laid-open No. 2011-249975 achieves a decrease in a dimension of the sheet metal holder.

In addition, Japanese Patent Laid-open No. 2012-14100 discloses a display device in which a front cabinet and a rear cabinet are joined by a housing, an image display panel is installed on the front cabinet, and a control substrate is fixed to the rear cabinet by a fixture (a first part having a male thread and a second part having a female thread). The second part has a tongue portion, and the tongue portion abuts a back surface of the display panel.

SUMMARY

In the case of the display device of Japanese Patent Laid-open No. 2011-249975, there are problems that the back cover has a complex shape, the replacement lid as a part for closing the concave portion is required, and the manufacturing process is complicated.

In the case of the display device of Japanese Patent Laid-open No. 2012-14100, after the rear cabinet is overlapped with the front cabinet, a force applied during inserting the screw acts in a direction in which the fixture is separated. Therefore, when there is a slight positional shift due to a dimensional error in the front or rear cabinet, if the screw is inserted while the position of a screw hole of the fixture and a screw insertion hole of the rear cabinet does not match, the fastener may be separated. When fixing several places in this way, if any one of the fixtures is separated, there is a need for reassembly, which results in a significant loss in assembly time.

Further, since the second part is fixed to the substrate only by inserting a protruding part included in the second part into a fitting hole formed in the substrate, fixation thereof may be unstable. That is, when inserting and withdrawing the fixture due to a repair of the substrate, or the like, and the size of the fitting hole of the substrate side is increased, it may become difficult for the fixture to maintain the fixation.

In consideration of the above-mentioned circumstances, it is an object of the present invention to provide a display device including a mounting member which may be fixed to a substrate with a simple structure without using a solder, and easily mount the substrate to another member having a simple structure, while maintaining stable fixation to the substrate, and a television receiver including the display device, and an electronic device including the mounting member.

A display device which includes a rectangular display unit which displays an image on a front side, a frame-shaped front cabinet which is disposed on the front side of the display unit, a rear cabinet which is disposed on a back side of the display unit, a substrate, and a circuit mounted on the substrate, wherein the rear cabinet and the substrate have a first screw insertion hole and a second screw insertion hole respectively, wherein the display device has a mounting member comprising: a first abutting plate part which is provided with a third screw insertion hole, and abuts a portion of an edge part of one plane of the substrate so that the third screw insertion hole overlaps the second screw insertion hole; a side abutting plate part which is connected to the first abutting plate part at a right angle, and abuts a side of the substrate; and a second abutting plate part which is connected to the side abutting plate part at a right angle, provided with a female thread at a position corresponding to the third screw insertion hole, and abuts a portion of an edge part of the other plane of the substrate, wherein, the rear cabinet abuts the first abutting plate part, with the mounting member being fixed to the substrate so that the third screw insertion hole overlaps the second screw insertion hole, and a screw is inserted into the first screw insertion hole, the third screw insertion hole and the second screw insertion hole, and screwed to the female thread.

In the display device according to the present invention, the first abutting plate part is provided with a protruding part on an abutting surface thereof, and the substrate is provided with a fitting part to which the protruding part is fitted.

In the display device according to the present invention, the front cabinet comprises a supporting part which supports the substrate.

In the display device according to the present invention, the mounting member comprises a conductive part which is connected to the second abutting plate part and comes into contact with a back face of the display part.

According to another aspect of the present invention, there is provided a television receiver comprising: the above-described display device; and a receiving part which receives a television broadcast, wherein the display device is configured to display an image based on the television broadcast received by the receiving part.

According to another aspect of the present invention, there is provided an electronic device comprising a substrate and a mounting member which mounts the substrate to another member, wherein the another member and the substrate have a first screw insertion hole and a second screw insertion hole respectively, wherein the mounting member comprises: a first abutting plate part which is provided with a third screw insertion hole, and abuts a portion of an edge part of one plane of the substrate so that the third screw insertion hole overlaps the second screw insertion hole; a side abutting plate part which is connected to the first abutting plate part at a right angle, and abuts a side of the substrate; and a second abutting plate part which is connected to the side abutting plate part at a right angle, provided with a female thread at a position corresponding to the third screw insertion hole, and abuts a portion of an edge part of the other plane of the substrate, wherein the another member abuts the first abutting plate part, with the mounting member being fixed to the substrate so that the third screw insertion hole overlaps the second screw insertion hole, and a screw is inserted into the first screw insertion hole, the third screw insertion hole and the second screw insertion hole, and screwed to the female thread.

In the present invention, since the mounting member formed in a U shape is fitted to the substrate so as to pinch the edge part of the substrate, the mounting member may be easily mounted to the substrate. After fitting the mounting member to the substrate, with the other member abutting the first abutting plate part, the screw is inserted into the other member, the first abutting plate part, and the substrate from the other member side, and screwed to the female thread.

In the display device of Japanese Patent Laid-open No. 2012-14100, a force applied during inserting the screw acts in the direction in which the fixture is separated, but in the present invention, since the mounting member is formed in a U shape, and mounted so as to pinch the substrate, the mounting member may not be separated during inserting the screw.

When mounting the substrate to the rear cabinet of the display device by the mounting member of the present invention, after performing connection of the circuit of the front cabinet side with the substrate and wiring shaping, the substrate is fixed to the rear cabinet by jointing the rear cabinet to the front cabinet, such that the wiring shaping and assembling may be easily performed.

In addition, in the present invention, without the need for the sheet metal holder of the display device described in Japanese Patent Laid-open No. 2011-249975, it is not necessary for the rear cabinet to be formed in a complex shape for fixing the substrate, and the replacement lid is not necessary, as well as the number of the parts may be reduced, and assembling workability may be improved with low manufacturing costs.

Further, a problem associated with fixing the mounting member by soldering may not occur, fixing strength may be stably maintained, and the parts may be mounted on both sides of the substrate.

When providing the protruding part on the first abutting plate part, the mounting member may be easily positioned during mounting it to the substrate. When fixing the mounting member to the substrate by using the structure of pinching in a U shape and the positioning protruding part, even if the mounting member is repeatedly inserted and withdrawn, a decrease in the fixing strength as in the invention of Japanese Patent Laid-open No. 2012-14100 may be suppressed.

In addition, when the mounting member includes the conductive part, grounding may be reinforced.

According to the mounting member of the present invention, it is possible to be fixed to the substrate with a simple structure without using a solder, and easily mount the substrate to another member such as the rear cabinet having a simple structure, while maintaining stable fixation to the substrate.

The above and further objects and features will more fully be apparent from the following detailed description with accompanying drawings.

BRIEF DESCRIPTION OF THE SEVERAL VIEWS OF THE DRAWINGS

FIG. 1 is a front perspective view illustrating an appearance of a TV receiver according to an embodiment of the present invention;

FIG. 2 is a cross-sectional view illustrating a mounting member according to the embodiment of the present invention;

Figure 3:
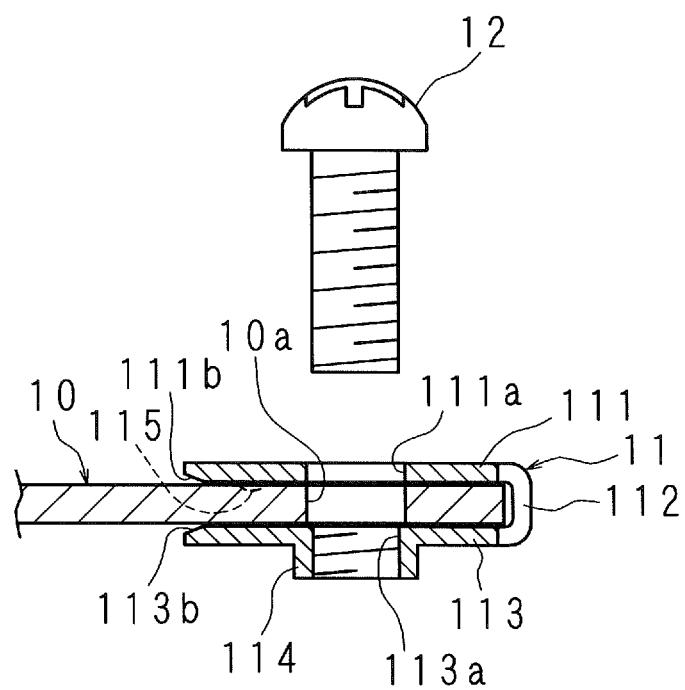
FIG. 3 is a cross-sectional view illustrating a state in which the mounting member according to the embodiment of the present invention is fitted to an edge part of the substrate.

Hereinafter, the present invention will be described in detail with reference to the accompanying drawings illustrating embodiments thereof.

FIG. 1 is a front perspective view illustrating an appearance of a TV receiver 1 according to an embodiment of the present invention.

The TV receiver 1 includes a laterally long display module 2 which displays an image, a tuner 16 which receives a broadcast wave from an antenna (not illustrated), and a decoder 17 which decodes an encoded broadcast wave. In the TV receiver 1, the broadcast wave received by the tuner 16 is decoded by the decoder 17 and an image is displayed on the display module 2 based on the decoded information. The TV receiver 1 is provided with a stand 7 at a lower portion thereof for supporting the TV receiver 1.

The display module 2 includes a backlight unit (not illustrated) which has a laterally long rectangular display panel 21 having a display surface on a front side thereof, an optical sheet, a diffusion plate, a reflection sheet, and a chassis. Backlights such as LEDs are provided in the chassis.

The display module 2 is housed longitudinally between a front cabinet 5 and a rear cabinet 6 disposed longitudinally in front and back respectively. The front cabinet 5 is a rectangular frame for covering peripheral edge parts of the display module 2, and has a rectangular opening 5a in the center thereof. The front cabinet 5 is made of plastic, for example. The rear cabinet 6 is formed in a rectangular tray shape with a front side open, and is also made of plastic, for example. Further, the front cabinet 5 and the rear cabinet 6 may be made of other material as well.

The vertical and lateral dimensions of the front cabinet 5 and the rear cabinet 6 are substantially the same, and peripheral edge portions thereof face each other. The vertical and lateral dimensions of the display panel 21 are slightly larger than those of the opening 5a of the front cabinet 5, and the peripheral edge portion of the display panel 21 faces an inner edge portion of the front cabinet 5.

Parts such as the above-described tuner 16 and the decoder 17 are mounted on the substrate 10 to be described below. In the present embodiment, the substrate 10 is mounted on the rear cabinet 6 through a mounting member 11.

Figure 4A:
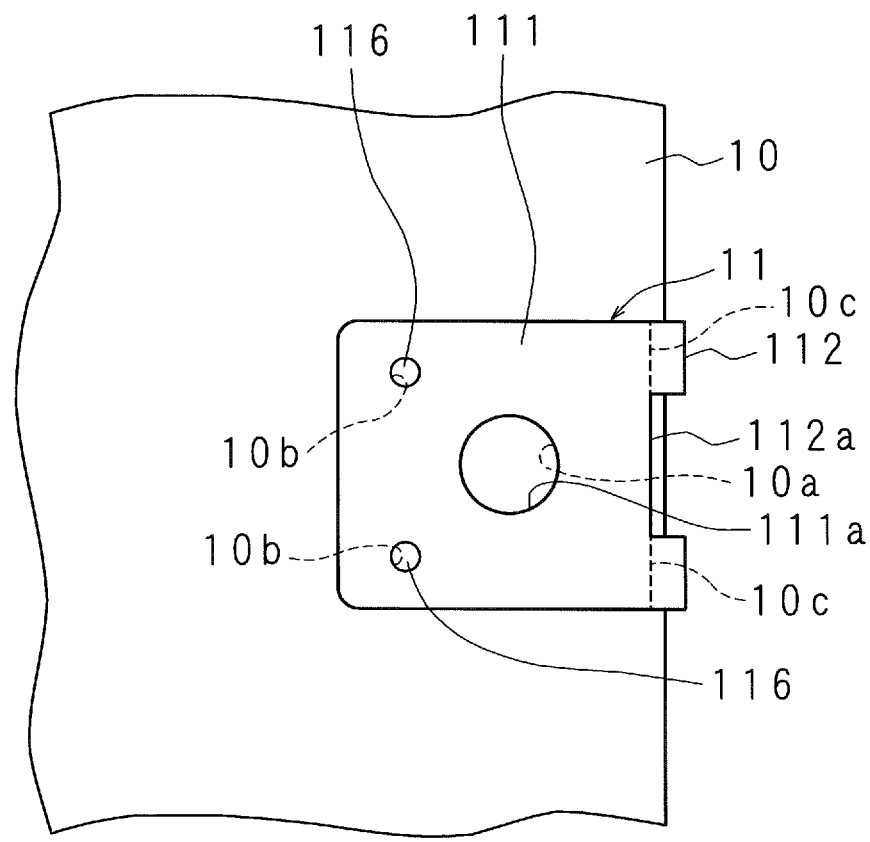
FIG. 4A is a plan view illustrating a portion of the substrate to which the mounting member is fixed according to the embodiment of the present invention.
Figure 4B:
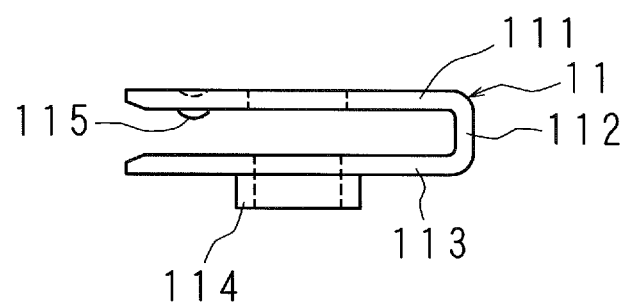
FIG. 4B is a side view of the mounting member according to the embodiment of the present invention.

FIG. 2 is a cross-sectional view illustrating the mounting member 11, FIG. 3 is a cross-sectional view illustrating a state in which the mounting member 11 is fitted to an edge part of the substrate 10, FIG. 4A is a plan view illustrating a portion of the substrate 10 to which the mounting member 11 is fixed (also referred to as a 'fixing portion'), and FIG. 4B is a side view of the mounting member 11.

The mounting member 11, for example, includes a first abutting plate part 111 formed in a square flat shape, a side abutting plate part 112 connected to the first abutting plate part 111 at a right angle, and a second abutting plate part 113 connected to the side abutting plate part 112 at a right angle.

The first abutting plate part 111 is provided with a screw insertion hole 111a in the center part thereof. Also, the first abutting plate part 111 is provided with a guide part 111b on a side opposite to the side abutting plate part 112, which has a tapered surface formed on an inner surface thereof in such a manner that the thickness thereof is gradationally decreased toward an end edge part. In addition, concaves 116 and 116 are formed on the first abutting plate part 111 by pressing on outer surfaces of both end portions in a direction parallel to the side abutting plate part 112 at portions separated from the end edge part at a prescribed interval, and protruding parts 115 and 115 are formed on the inner surface of the first abutting plate part 111. Herein, although it is not limited to the case of providing the protruding parts 115 and 115, but as described below, it is preferable to provide the protruding parts due to facilitating of positioning, when mounting the mounting member 11 to the substrate 10.

The side abutting plate part 112 is provided with an opening 112a formed in the center part thereof so as to be recessed to the screw insertion hole 111a side in a plan view. Herein, it is not limited to the case of providing the opening 112a in the side abutting plate part 112.

The second abutting plate part 113 is provided with a female thread 113a in the center part thereof formed in such a manner that a low height cylindrical screw part 114 is formed by burring the outer surface thereof, and then performing a screw hole machining on the inner surface of the second abutting plate part 113. Also, the second abutting plate part 113 is provided with a guide part 113b on the side opposite to the side abutting plate part 112, which has a tapered surface formed on an inner surface thereof in such a manner that the thickness thereof is gradationally decreased toward an end edge part.

The substrate 10 is provided with a screw insertion hole 10a in the center part of the portion to which the mounting member 11 is fixed, and fitting parts 10b and 10b on the center part side from the screw insertion hole 10a to which the protruding parts 115 and 115 are fitted (see FIGS. 2 and 4). The fitting part 10b may be a hole penetrating the substrate 10.

Also, the substrate 10 is provided with concave parts 10c and 10c on both end portions of the end edge of the fixing portion thereof. Herein, it is not limited to the case of providing the concave part 10c.

The mounting member 11 having the above-described configuration slides to the fixing portion of the end edge of the substrate 10 in such a manner that, while guiding by the guide parts 111b and 113b, the protruding parts 115 and 115 are fitted to the fitting parts 10b and 10b, both end portions of the side abutting plate part 112 are fitted to the concave parts 10c and 10c, and a portion between the concave parts 10c and 10c of the substrate 10 is inserted into the opening 112a so as to be fitted to the substrate 10.

The first abutting plate part 111 abuts the fixing portion of the end edge of one plane of the substrate 10, the side abutting plate part 112 abuts a side of the substrate 10 extending to the fixing portion, and the second abutting plate part 113 abuts a portion of an end edge of the other plane of the substrate 10.

In this state, the first abutting plate part 111 of the mounting member 11 abuts a prescribed position of a surface of the front side of the rear cabinet 6, and a screw 12 is inserted into a screw insertion hole formed in a prescribed position of the rear cabinet 6, the screw insertion hole 111a of the first abutting plate part 111, and the screw insertion hole 10a of the substrate 10, and screwed to the screw part 114, such that the substrate 10 is mounted to the rear cabinet 6 (see FIG. 3, however, the rear cabinet 6 is not illustrated).

Figure 5:
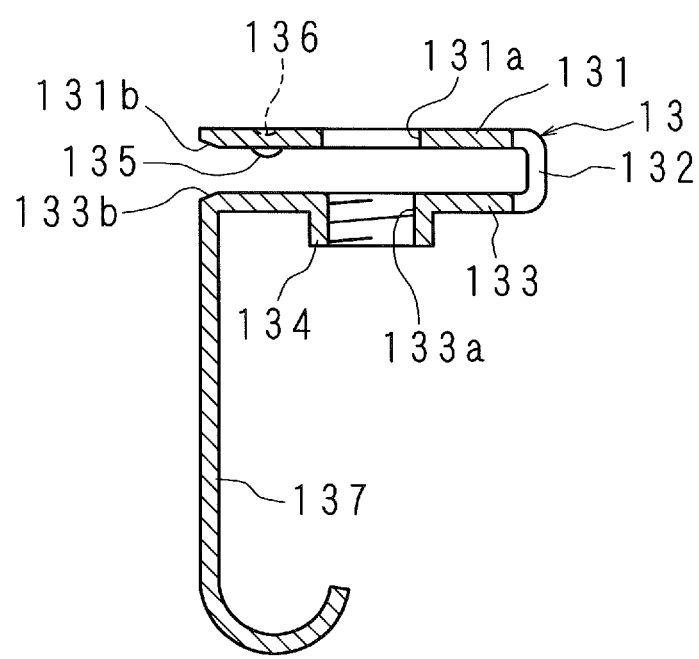
FIG. 5 is a cross-sectional view illustrating another mounting member.

FIG. 5 is a cross-sectional view illustrating another mounting member 13.

The mounting member 13 may be made of stainless steel, for example, and includes a first abutting plate part 131 formed in a square flat shape, a side abutting plate part 132 connected to the first abutting plate part 131 at a right angle, a second abutting plate part 133 connected to the side abutting plate part 132 at a right angle, and a display module abutting part 137 which is connected to the second abutting plate part 133 at a right angle and formed in an L shape in a side view.

The first abutting plate part 131 is provided with a screw insertion hole 131a in the center part thereof. Also, the first abutting plate part 131 is provided with a guide part 131b on a side opposite to the side abutting plate part 132, which has a tapered surface formed on an inner surface thereof in such a manner that the thickness thereof is gradationally decreased toward an end edge part. In addition, concaves 136 and 136 are formed on the first abutting plate 131 part by pressing on outer surfaces of portions separated from the end edge part at a prescribed interval (see FIG. 6), and protruding parts 135 and 135 are formed on the inner surface of the first abutting plate part 131.

The side abutting plate part 132 is provided with an opening (not illustrated) formed in the center part thereof so as to be recessed to the screw insertion hole 131a side in a plan view.

The second abutting plate part 133 is provided with a female thread 133a in the center part thereof formed in such a manner that a low height cylindrical screw part 134 is formed by burring the outer surface thereof, and then performing a screw hole machining on the inner surface of the second abutting plate part 133. Also, the second abutting plate part 133 is provided with a guide part 133b on the side opposite to the side abutting plate part 132, which has a tapered surface formed on an inner surface thereof in such a manner that the thickness thereof is gradationally decreased toward an end edge part.

The display module abutting part 137 is provided so as to be laid along the guide part 133b, and includes an L-shaped short side whose center part is bent to the outside and an end portion which is formed so as to face the side abutting plate part 132 side.

The mounting member 13 having the above-described configuration is fitted to the substrate 10 by sliding to the fixing portion of the end edge of the substrate 10 in such a manner that, while guiding by the guide parts 131b and 133b, the protruding parts 135 and 135 are fitted to a fitting part 10b of the substrate 10. Then, the display module abutting part 137 abuts a back surface of the display module 2 (chassis).

Figure 6:
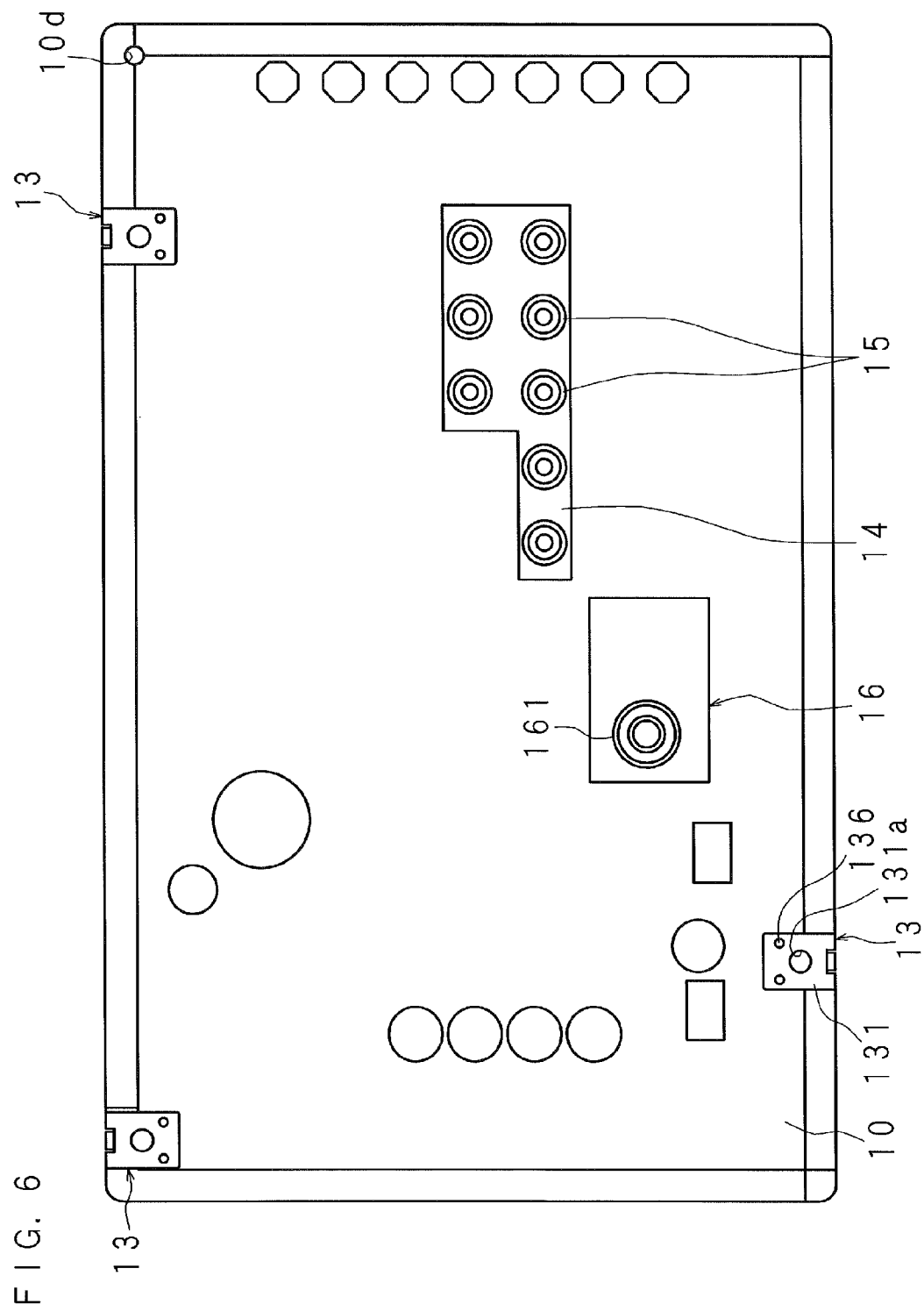
FIG. 6 is a plan view illustrating a state in which three mounting members pinch the substrate according to the embodiment of the present invention.
Figure 7:
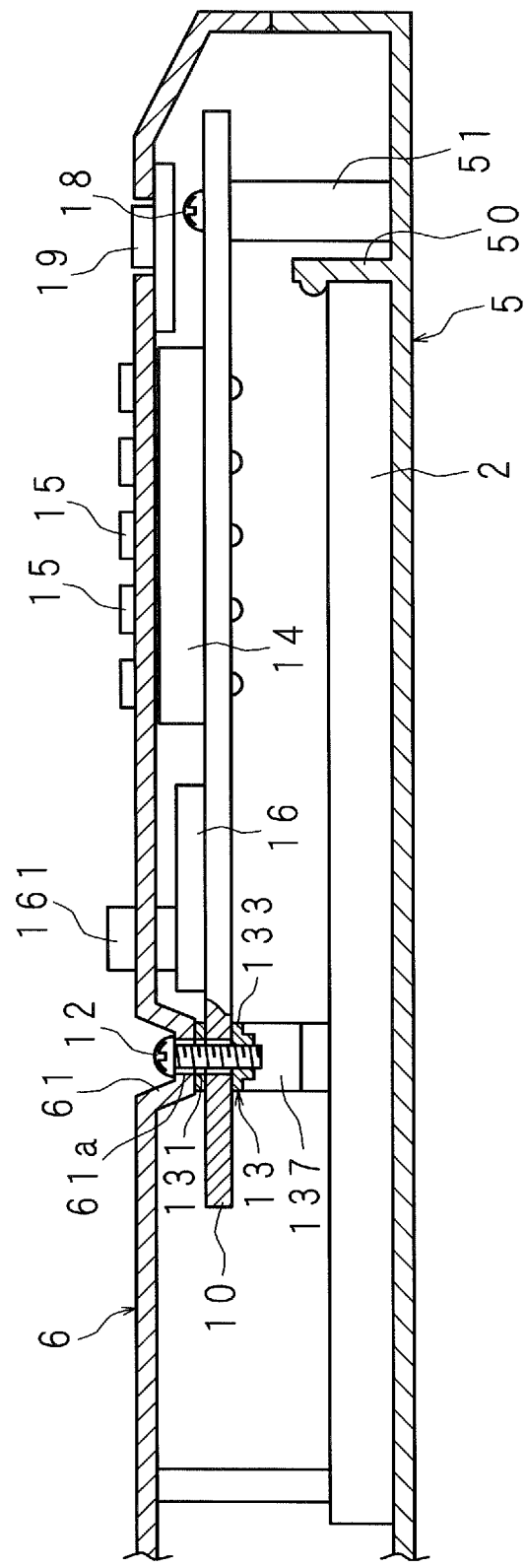
FIG. 7 is a cross-sectional view illustrating the TV receiver with being cut on a surface parallel to a longitudinal direction thereof, when the substrate according to the embodiment of the present invention is fixed to the rear cabinet.
Figure 8:
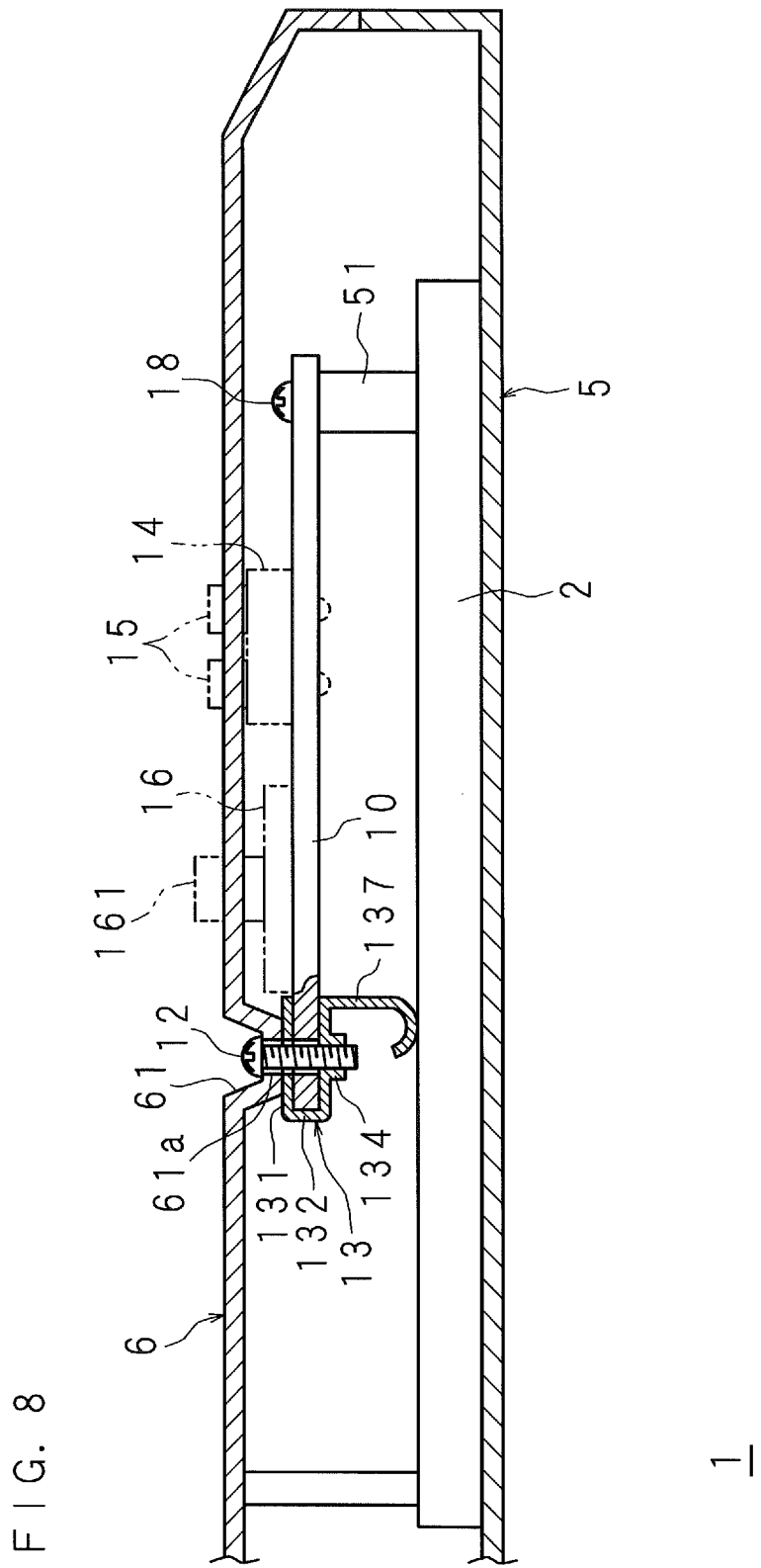
FIG. 8 is a cross-sectional view illustrating the TV receiver with being cut on a surface parallel to a width direction thereof, when the substrate according to the embodiment of the present invention is fixed to the rear cabinet.

FIG. 6 is a plan view illustrating a state in which three mounting members 13 pinch the substrate 10, FIG. 7 is a cross-sectional view illustrating the TV receiver 1 with being cut on a surface parallel to a longitudinal direction thereof, when the substrate 10 is fixed to the rear cabinet 6, and FIG. 8 is a cross-sectional view illustrating the TV receiver 1 with being cut on a surface parallel to a width direction thereof, when the substrate 10 is fixed to the rear cabinet 6. Herein, the substrate 10 will be described as a main substrate. Further, in FIG. 8, a pin jack base 14 and the tuner 16 are illustrated by a virtual line.

The front cabinet 5 includes a hook 50 therein for holding the display module 2. The hook 50 supports the display module 2 itself which integrally holds the optical sheet, the diffusion plate, the reflection sheet, and the chassis at the back side portion of the TV receiver 1.

The front cabinet 5 includes a column-shaped supporting part 51 provided on a peripheral edge side portion thereof. The supporting part 51 is provided with a female thread in an end face thereof.

The rear cabinet 6 includes three screw insertion parts 61 protruding to the front side. The screw insertion part 61 is provided with a screw insertion hole 61a in an end face thereof.

The tuner 16 having an antenna input terminal 161 is mounted on a lower side of the center part of the substrate 10. The pin jack base 14 having a plurality of pin jacks 15 is soldered near the center of a right side of the tuner 16.

The substrate 10 is provided with a screw insertion hole 10d at a right upper corner.

A portion of the substrate 10 abutting the second abutting plate part 133 of the mounting member 13 is adopted so as not to be subjected to a resist processing.

The mounting members 13 are fitted at a left end portion and near a slightly center portion of a right end portion of an upper side, as well as near a slightly center portion of a left end portion of a lower side of the substrate 10, as described above.

The chassis of the display module 2 may be made of metal such as aluminum or the like.

When assembling the TV receiver 1, a screw 18 is inserted into the screw insertion hole 10d of the substrate 10, and screwed to a female thread of the supporting part 51, thereby the substrate 10 is temporarily fixed thereto. The supporting part 51 also plays a role of a spacer to horizontally hold the substrate 10. Since the screw 18 is fitted for temporarily fixing the substrate 10, as an alternative for the screw 18, the supporting part 51 may be provided with a protrusion so as to pass through the screw insertion hole 10d of the substrate 10.

Then, the display module abutting part 137 abuts the chassis of the display module 2. Since the portion of the substrate 10 abutting the second abutting plate part 133 of the mounting member 13 is adopted so as not to be subjected to the resist processing, conduction between the mounting member 13 and the substrate 10 may be secured, and by abutting the display module abutting part 137 to the chassis, conduction between the display module 2 and the substrate 10 may also be secured.

A plurality of circuit members such as the display panel 21, the backlight, and the like, which require a control from the substrate 10 as the main substrate, are arranged on the front cabinet 5 side. Therefore, before the rear cabinet 6 is jointed to the front cabinet 5, the circuit members and the substrate 10 are electrically connected with each other, and then wiring shaping is performed.

When all the connection and wiring shaping are completed, the rear cabinet 6 is jointed to the front cabinet 5. Then, the screw 12 is inserted into the screw insertion hole 61a of the rear cabinet 6, the screw insertion hole 131a of the mounting member 13, and the screw insertion hole 10a of the substrate 10, and screwed to the female thread 133a, such that the substrate 10 is fixed to the rear cabinet 6. Since the mounting member 13 is accurately positioned and fixed to the substrate 10 by the protruding part 135, even in the state in which the mounting member 13 is not visually confirmed, it is possible to screw the rear cabinet 6 to the substrate 10.

In the present embodiment, the mounting members 11 and 13 are formed in a U shape, and the position thereof is fixed by fitting the positioning protruding parts 115 and 135 to the fitting part 10b, so as to be easily fitted to the substrate 10. In addition, since the female threads 113a and 133a are provided so as to be positioned on a side opposite to the side on which the rear cabinet 6 is disposed, when the screw 12 is screwed to the female threads 113a and 133a, the mounting members 11 and 13 move together with the substrate 10 to the rear cabinet 6 side and are fixed thereto.

Unlike the display device of Japanese Patent Laid-open No. 2012-14100, since the mounting member has a structure of pinching the substrate 10, the mounting members 11 and 13 are not separated in a direction in which a force is applied to the mounting members 11 and 13 during inserting the screw 12, and a loss in work productivity and time due to reassembling may not occur. Further, in the present embodiment, since the mounting member is fixed by the pinching structure and the positioning protruding parts 115 and 135, even if the mounting members 11 and 13 are repeatedly inserted and withdrawn, there is no effect on maintaining the fixation.

In the present embodiment, after performing the connection and wiring shaping, the substrate 10 is fixed to the rear cabinet 6 by jointing the rear cabinet 6 to the front cabinet 5, such that the wiring shaping and assembling may be easily performed. When the front cabinet 5 has the supporting part 51, since a space is maintained between the substrate 10 and the display module 2, the wiring shaping and assembling may be further easily and reliably performed.

In addition, in the present embodiment, without the need for the sheet metal holder of the display device described in Japanese Patent Laid-open No. 2011-249975, it is not necessary for the rear cabinet to be formed in a complex shape for fixing the substrate, and the replacement lid is not necessary, as well as the number of the parts may be reduced, and assembling workability may be improved with low manufacturing costs.

Further, a problem associated with fixing the mounting member by soldering may not occur, fixing strength may be stably maintained, and the parts may be mounted on both sides of the substrate 10.

In addition, by using the mounting member 13 having the display module abutting part 137, grounding may be reinforced. It is possible to provide a similar structure in the case of the lug by soldering, however, until incorporating into a set after soldering, the protrusions are present during storage of the substrate, and when a conductive portion is bent, securing of conduction may become difficult. Therefore, it is necessary to pay attention to handling. In the present embodiment, since it is possible to mount the mounting member 13 just before incorporating into the set, there is no need to perform a special handling as described above.

In present embodiment, the case that the substrate 10 is applied as the main substrate is described, however, it is not limited thereto, and the present invention may also be applied to a substrate such as a power substrate or the like. In this case, the mounting members 11 and 13 may be provided at four corners of the substrate.

As this description may be embodied in several forms without departing from the spirit of essential characteristics thereof, the present embodiment is therefore illustrative and not restrictive, since the scope is defined by the appended claims rather than by the description preceding them, and all changes that fall within metes and bounds of the claims, or equivalence of such metes and bounds thereof are therefore intended to be embraced by the claims.

The invention claimed is:

1. A display device which includes a rectangular display unit which displays an image on a front side, a frame-shaped front cabinet which is disposed on the front side of the display unit, a rear cabinet which is disposed on a back side of the display unit, a substrate, and a circuit mounted on the substrate,
    wherein the rear cabinet and the substrate have a first screw insertion hole and a second screw insertion hole respectively,
    wherein the display device has a mounting member comprising:
    a first abutting plate part which is provided with a third screw insertion hole, and abuts a portion of an edge part of one plane of the substrate so that the third screw insertion hole overlaps the second screw insertion hole;
    a side abutting plate part which is connected to the first abutting plate part at a right angle, and abuts a side of the substrate; and
    a second abutting plate part which is connected to the side abutting plate part at a right angle, provided with a female thread at a position corresponding to the third screw insertion hole, and abuts a portion of an edge part of the other plane of the substrate,
    wherein the rear cabinet abuts the first abutting plate part, with the mounting member being fixed to the substrate so that the third screw insertion hole overlaps the second screw insertion hole, and a screw is inserted into the first screw insertion hole, the third screw insertion hole and the second screw insertion hole, and screwed to the female thread.

2. The display device according to claim 1, wherein the mounting member comprises a conductive part which is connected to the second abutting plate part and comes into contact with a back face of the display part.

3. The display device according to claim 1, wherein the first abutting plate part is provided with a protruding part on an abutting surface thereof, and
    the substrate is provided with a fitting part to which the protruding part is fitted.

4. The display device according to claim 2, wherein the first abutting plate part is provided with a protruding part on an abutting surface thereof, and the substrate is provided with a fitting part to which the protruding part is fitted.

5. The display device according to claim 1 wherein the front cabinet comprises a supporting part which supports the substrate.

6. The display device according to claim 2 wherein the front cabinet comprises a supporting part which supports the substrate.

7. The display device according to claim 3 wherein the front cabinet comprises a supporting part which supports the substrate.

8. The display device according to claim 4 wherein the front cabinet comprises a supporting part which supports the substrate.

9. A television receiver comprising:
the display device according to claim 1; and
a receiving part which receives a television broadcast,
wherein the display device is configured to display an image based on the television broadcast received by the receiving part.

10. A television receiver comprising:
the display device according to claim 2; and
a receiving part which receives a television broadcast,
wherein the display device is configured to display an image based on the television broadcast received by the receiving part.

11. A television receiver comprising:
the display device according to claim 3; and
a receiving part which receives a television broadcast,
wherein the display device is configured to display an image based on the television broadcast received by the receiving part.

12. A television receiver comprising:
the display device according to claim 4; and
a receiving part which receives a television broadcast,
wherein the display device is configured to display an image based on the television broadcast received by the receiving part.

13. A television receiver comprising:
the display device according to claim 5; and
a receiving part which receives a television broadcast,
wherein the display device is configured to display an image based on the television broadcast received by the receiving part.

14. A television receiver comprising:
the display device according to claim 6; and
a receiving part which receives a television broadcast,
wherein the display device is configured to display an image based on the television broadcast received by the receiving part.

15. A television receiver comprising:
the display device according to claim 7; and
a receiving part which receives a television broadcast,
wherein the display device is configured to display an image based on the television broadcast received by the receiving part.

16. A television receiver comprising:
the display device according to claim 8; and
a receiving part which receives a television broadcast,
wherein the display device is configured to display an image based on the television broadcast received by the receiving part.

17. An electronic device comprising a substrate and a mounting member which mounts the substrate to another member,
wherein the another member and the substrate have a first screw insertion hole and a second screw insertion hole respectively,
wherein the mounting member comprises:
a first abutting plate part which is provided with a third screw insertion hole, and abuts a portion of an edge part of one plane of the substrate so that the third screw insertion hole overlaps the second screw insertion hole;
a side abutting plate part which is connected to the first abutting plate part at a right angle, and abuts a side of the substrate; and
a second abutting plate part which is connected to the side abutting plate part at a right angle, provided with a female thread at a position corresponding to the third screw insertion hole, and abuts a portion of an edge part of the other plane of the substrate,
wherein the another member abuts the first abutting plate part, with the mounting member being fixed to the substrate so that the third screw insertion hole overlaps the second screw insertion hole, and a screw is inserted into the first screw insertion hole, the third screw insertion hole and the second screw insertion hole, and screwed to the female thread.

* * * * *